United States Patent [19]

Itoh

[11] Patent Number: 5,227,196

[45] Date of Patent: Jul. 13, 1993

[54] METHOD OF FORMING A CARBON FILM ON A SUBSTRATE MADE OF AN OXIDE MATERIAL

[75] Inventor: Kenji Itoh, Kanagawa, Japan

[73] Assignee: Semiconductor Energy Laboratory Co., Ltd., Atsugi, Japan

[21] Appl. No.: 749,441

[22] Filed: Sep. 26, 1991

Related U.S. Application Data

[63] Continuation-in-part of Ser. No. 480,163, Feb. 14, 1990, abandoned.

[30] Foreign Application Priority Data

Feb. 16, 1989 [JP]  Japan .................................. 1-36896

[51] Int. Cl.$^5$ .................. C23C 16/26; C23C 16/34
[52] U.S. Cl. ........................................ 427/249; 427/255;
  427/255.1; 427/255.7; 428/698; 428/699
[58] Field of Search .................. 427/255.7, 255.1, 249,
  427/255; 428/698, 699

[56] References Cited

U.S. PATENT DOCUMENTS

| | | | |
|---|---|---|---|
| 4,132,818 | 1/1979 | Chappelow et al. | 427/248.1 |
| 4,699,801 | 10/1987 | Ito et al. | 427/53.1 |
| 4,707,384 | 11/1987 | Schachner et al. | 427/249 |
| 4,737,379 | 4/1988 | Hudgens et al. | 427/39 |
| 4,755,426 | 7/1988 | Kokai et al. | 428/336 |
| 4,988,421 | 1/1991 | Drawl et al. | 204/192.3 |

*Primary Examiner*—Shrive Beck
*Assistant Examiner*—Bret Chen
*Attorney, Agent, or Firm*—Sixbey, Friedman, Leedom & Ferguson

[57] ABSTRACT

A lamination of films is comprised of at least two film layers wherein a first film with the smallest internal stress is provided for the first layer directly on the substrate, and a second film is provided with the second smallest amount of internal stress for the second layer on the first layer, and when more than two layers are provided, additional layers of films are provided with increasing magnitude of internal stress, in sequence, in the direction of lamination from the side of the substrate. In accordance with one aspect, the hydrogen concentration of a silicon nitride layer is controlled to obtain optimum properties of the silicon nitride layer as a buffer layer between a carbon layer and an oxide substrate.

10 Claims, 5 Drawing Sheets

METHOD OF FORMING A CARBON FILM ON A SUBSTRATE MADE OF AN OXIDE MATERIAL

This application is a continuation-in-part of Ser. No. 07/480163 filed on Feb. 14, 1990, now abandoned.

BACKGROUND OF THE INVENTION

1. Field of the Invention

The present invention relates to lamination of films formed in many layers on a substrate such as, for example, a substrate with an oxide surface.

2. Description of the Prior Art

Up to the present, many attempts have been made to form a film of carbon or a film in which carbon is the main component, which are hereinafter referred to as a carbon-type film, on various types of substrates. However, some substrates have poor interface characteristics, in particular the adhesion characteristics, with some carbon-type films. Cracking and peeling often occur, and the advantages of the carbon-type film, for example, resistance to wear, high degree of smoothness, high hardness, and the like, have not been adequately attained.

When a conventional carbon-type film is formed directly on a substrate, if the film is thin, there is often no problem with adhesion, but if the film is thick, there is a high possibility of cracking and peeling.

For example, when a carbon-type film formed on a substrate at 350° C. or greater is left at a room temperature, the carbon-type film will eventually drop off or peel away. Also, when a carbon-type film formed at a room temperature is subjected to the heat treatment at a high temperature such as 400° C. or greater, specks of the film peel away or the film falls off.

The film in the former case is generally said to be subject to thermal stress, which is produced because of the difference between the thermal expansion coefficient (or thermal contraction coefficient) of the film itself and that of the substrate. In the latter case, the effect of stress relief by hydrogen is reduced because of the decrease in C-H bonds (hydrogen contents) throughout the film.

Many attempts have been made to deposit carbon coatings on a surface of various types of substrates; however, when a substrate is made of an oxide material, C-0 bonds tend to be formed at an interface between the oxide material and the carbon coating. As a result, the reliability of the coating for example, the adhesivity of the coating to the substrate is degraded. On the other hand, it has been known to interpose a buffer layer such as a silicon nitride layer at the interface between the substrate and the carbon coating; however, sufficient results have not been obtained.

In accordance with the present invention, it has been recognized that the physical properties of the laminate member composed of the carbon layer and the silicon nitride layer formed on the oxide substrate are largely influenced by a hydrogen concentration in the silicon nitride layer.

SUMMARY OF THE INVENTION

An object of the present invention is to provide, with due consideration to the drawbacks of such conventional devices, a carbon-type film formed on a substrate wherein the interface characteristics of the film with the substrate (in particular, the adhesion characteristics) are good, cracking and peeling do not occur, and the advantages of a carbon-type film with respect to resistance to wear, high degree of smoothness, high hardness and the like are adequately demonstrated.

This object is achieved in the present invention by the provision of a lamination of films wherein, when the films are formed on the substrate, a film which is exposed to air (called a final film) is not formed directly on the substrate, but a film (a first film) which has the smallest amount of internal stress of the layers among the films is formed directly on the substrate, and on this first film, a film (a second film) which has the second smallest internal stress among the films is formed. Thus layers in the lamination of films are then provided with increasing magnitude of internal stress, in sequence, and, finally, the desired film (specifically, the final film) which has the largest internal stress among the films is formed. In a film with resistance to wear, a high degree of smoothness, high hardness and the like is adopted for this final film, and it is possible to provide the characteristics of resistance to wear, a high degree of smoothness, high hardness and the like to the surface of the substrate.

In the present invention, stress strain is reduced and the reduction derives from decrease of differential thermal strain between the laminate and the underlying surface, the lattice alignment, and the hydrogen content of the film. Because of the reduction cracking and peeling of the films are prevented.

In the present invention, not a single layer of film but a lamination of films in multi-layers is formed on the substrate. With the lamination of films, the adherence of film to the substrate is improved, and the alignment of film with the film-forming surface of the substrate is also improved Further, the relative relationship between thermal stress and the hydrogen content of the film can be controlled by selection of the starting raw material gas and the film-forming conditions, so that the residual stress in the films is controlled to improve the adhesion characteristics between the substrate and the lamination of films on the substrate.

In the present invention, the conventional difficulty in application of the carbon-type film is eliminated by adopting a lamination of films in lamination structure, wherein the interface characteristics, in particular the initial change and the change with time in adhesion characteristics, are improved.

With due consideration of the above-mentioned drawbacks of the prior art, the present invention also provides an excellent laminate member of a silicon nitride layer and a carbon layer on an oxide substrate and a method for forming the laminate Specifically, the present invention proposes a method for forming an optimum silicon nitride layer as the buffer layer between the oxide substrate and the carbon layer.

In accordance with one aspect of the present invention, it has been recognized that the adhesion of the carbon layer is optimized when the silicon nitride layer interposed between the substrate and the carbon layer contains hydrogen at a concentration of 2-28 atomic %, preferably 12-18 atomic % If the hydrogen concentration is higher than 29 atomic %, the substrate tends to react with the hydrogen contained in the silicon nitride layer and form O-H bonds and thus tends to be deteriorated or decomposed. Also, the hydrogen tends to diffuse into the carbon layer formed thereon and as a result, it is difficult to control the properties of the carbon layer. If the concentration is lower than 2%, it is not possible to form an optimum silicon nitride layer, that is, the internal stress of the silicon nitride layer is unavoidably increased, and therefore, the reliability of the laminate member is degraded. Therefore, with the concentration of the 2-28 atomic %, it is possible to achieve the maximum reliability of the laminate member and at the same time, the properties of the substrate can also be maintained.

Also, in accordance with another aspect of the present invention, the thickness of the silicon nitride layer is kept within 15-25% of the thickness of the carbon layer formed thereon. If the silicon nitride layer is thicker than the above thickness range, it is not possible to reduce the influence of the internal stress of the carbon layer and as a result, the laminate member tends to crack or peel off. If the silicon nitride layer is too thick, the effect of the silicon nitride layer is saturated. Therefore, the laminate member can achieve the optimum characteristics when the silicon nitride layer has a thickness within 15-25% of the thickness of the carbon layer.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

In the present invention, taking into consideration the fact that when a film in various types in the prior art structures, for example, a carbon-type film, is formed directly on a substrate, the resulting film tends to drop off or peel away. In order to eliminate these drawbacks, a lamination of films is provided in at least two film layers wherein a first film with the smallest internal stress among the films is provided for a first layer directly on the substrate, and a second film is provided with the second smallest amount of internal stress for a second layer directly on the first layer. Subsequently, the remaining films in the lamination of films are provided for the remaining layers with increasing magnitude of internal stress, in sequence, in the direction of lamination from the substrate out, thereby forming the lamination of films. The lamination of films formed in this manner provides good interface characteristics wherein dropping off or peeling away of the film is reduced or eliminated than is the case where only one layer of film is formed on the substrate.

In one embodiment, a lamination of films has a structure wherein a film layer of silicon nitride is formed directly on a substrate and a carbon-type film layer is formed on the film layer of silicon nitride.

Figure 1:
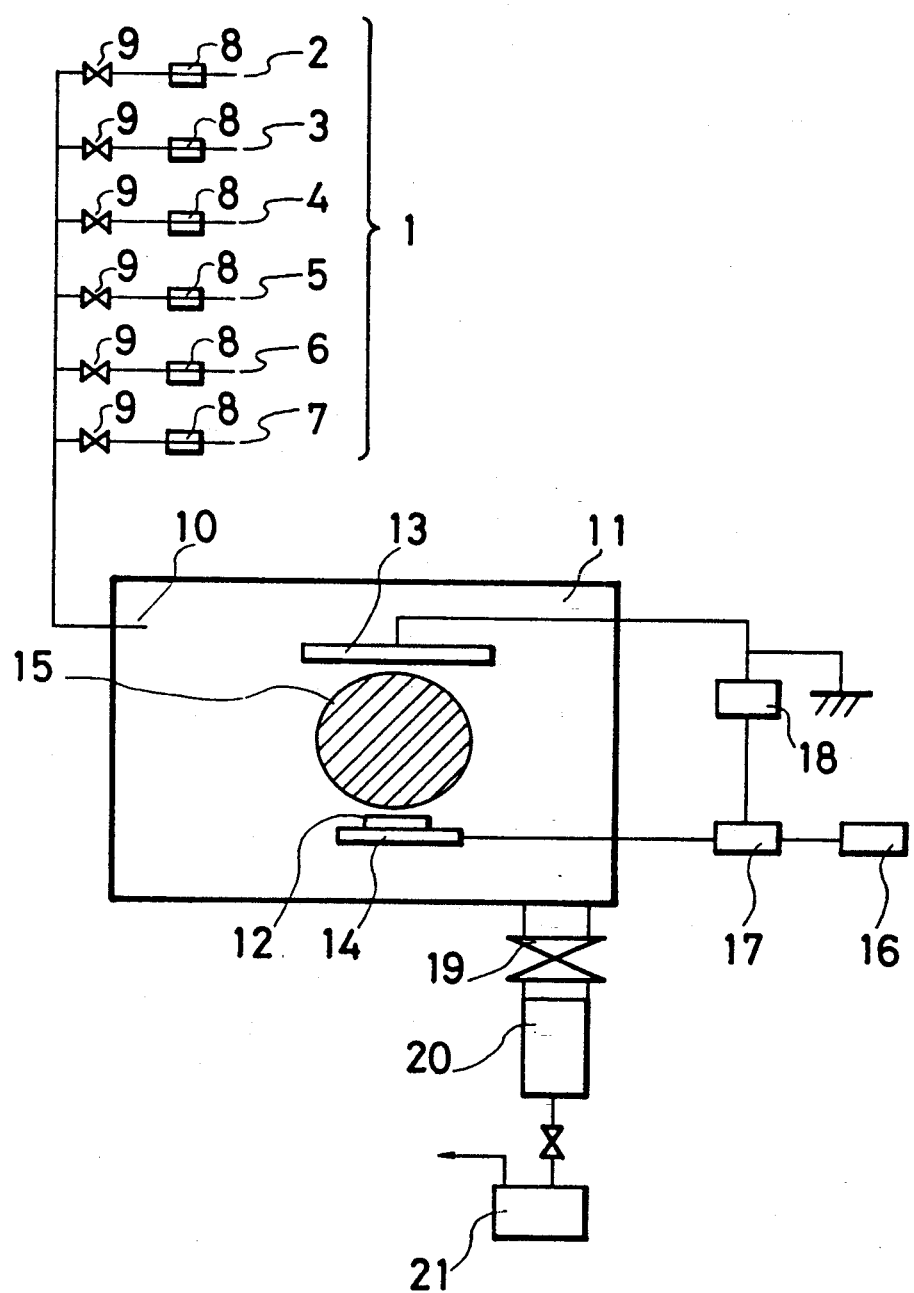
FIG. 1 is a diagram outlining a plasma device of parallel plate type used in the implementation of embodiments in the present invention.

FIG. 1 shows a plasma device of parallel plate type to produce such a lamination of films. In a gas system 1 of this device, first, in order to form a silicon nitride film layer directly on the substrate a hydrogen silicide gas, which is a reactive gas, for example silane and disilane, is introduced from a source 2 and is introduced into a reaction system 11 by a nozzle 10 through a flowmeter 8 and a valve 9 and nitrogen and ammonia are introduced from a source 4 and are introduced into the reaction system 11 by the nozzle 10 through the flowmeter 8 and the valve 9.

To form the carbon-type film layer on the silicon nitride film layer, a hydrocarbon gas, which is a reactive gas, is introduced from a source 3 and nitrogen is introduced from the source 4 in the same manner through the flowmeter 8 and the valve 9.

Examples of a hydrocarbon gas in the present invention are gases such as methane, ethane, ethylene, a hydrocarbon of methane series ($C_nH_{2n+2}$) and the like, and also silicon carbides such as tetramethylsilane (($CH_3)_4Si$), and tetraethylsilane (($C_2H_5)_4Si$) and the like, or carbon chloride such as carbon tetrachloride ($CCl_4$) and the like are used to form the carbon-type film layer.

Carbon trifluoride gas which is used to etch the films in the present invention is introduced from a source 5, and oxygen from a source 6. When plasma cleaning of the substrate is necessary, an inert gas such as argon can be introduced as a preprocessing gas from a source 7.

The forming and etching of the silicon nitride and carbon-type films are performed under reduced pressure in a reaction system 11. In the reaction system 11, electrical energy is added between a first electrode 13 and a second electrode 14 from a high frequency power source 16, a matching transformer 17 and a direct current power source 18 to produce a plasma 15. The desired silicon nitride and carbon-type films are formed in laminated layers by means of the plasma 15.

Any unnecessary substances remaining after the reaction are discharged from the reaction system 11 through an evacuating system comprising a pressure adjusting valve 19, a turbo-molecular pump 20, and a rotary pump 21.

Figure 2:
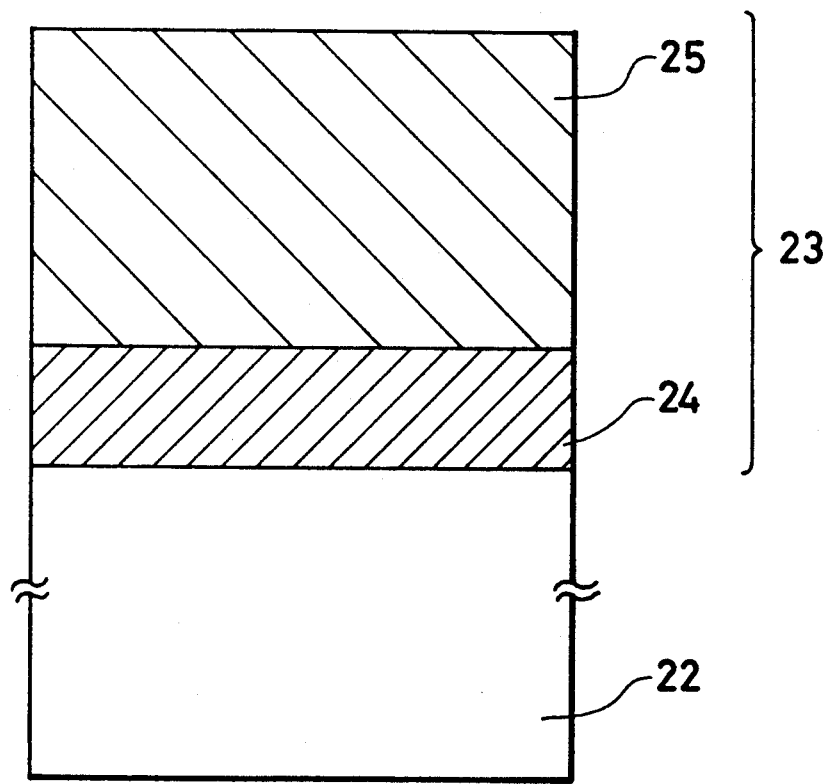
FIG. 2 is a sectional view of a lamination of films in the present invention.

A lamination of films 23 is formed from a silicon nitride film 24 and a carbon-type film 25 in a laminated structure on a substrate 22 as shown in FIG. 2. Because of this laminated structure, dropping or peeling of the films can be greatly reduced.

In this embodiment of the present invention, the conditions for forming the silicon nitride film were:
reaction temperature, 150° C. to 350° C.; reaction pressure, 0.01 to 0.5 torr; high frequency electric energy density, 0.1 to 0.3 W/cm$^2$; and self-bias voltage, −150 to −250 V. The ratio of the raw material gases, SiH$_4$ and N$_2$, expressed as SiH$_4$/N$_2$ was varied in the 0.05 to 0.5 range. It was possible to control the composition ratio stoichiometrically and also control the hydrogen content of the silicon nitride film taking into consideration the film stress.

Basically, the same type of procedure was also carried out for the carbon-type film. The conditions for forming the carbon-type film were:
reaction temperature, 150° C. to 350° C.; reaction pressure, 0.01 to 0.5 torr; high frequency electric energy density, 0.1 to 0.3 W/cm$^2$; and self-bias voltage, −150 to −250 V.

Figure 3:
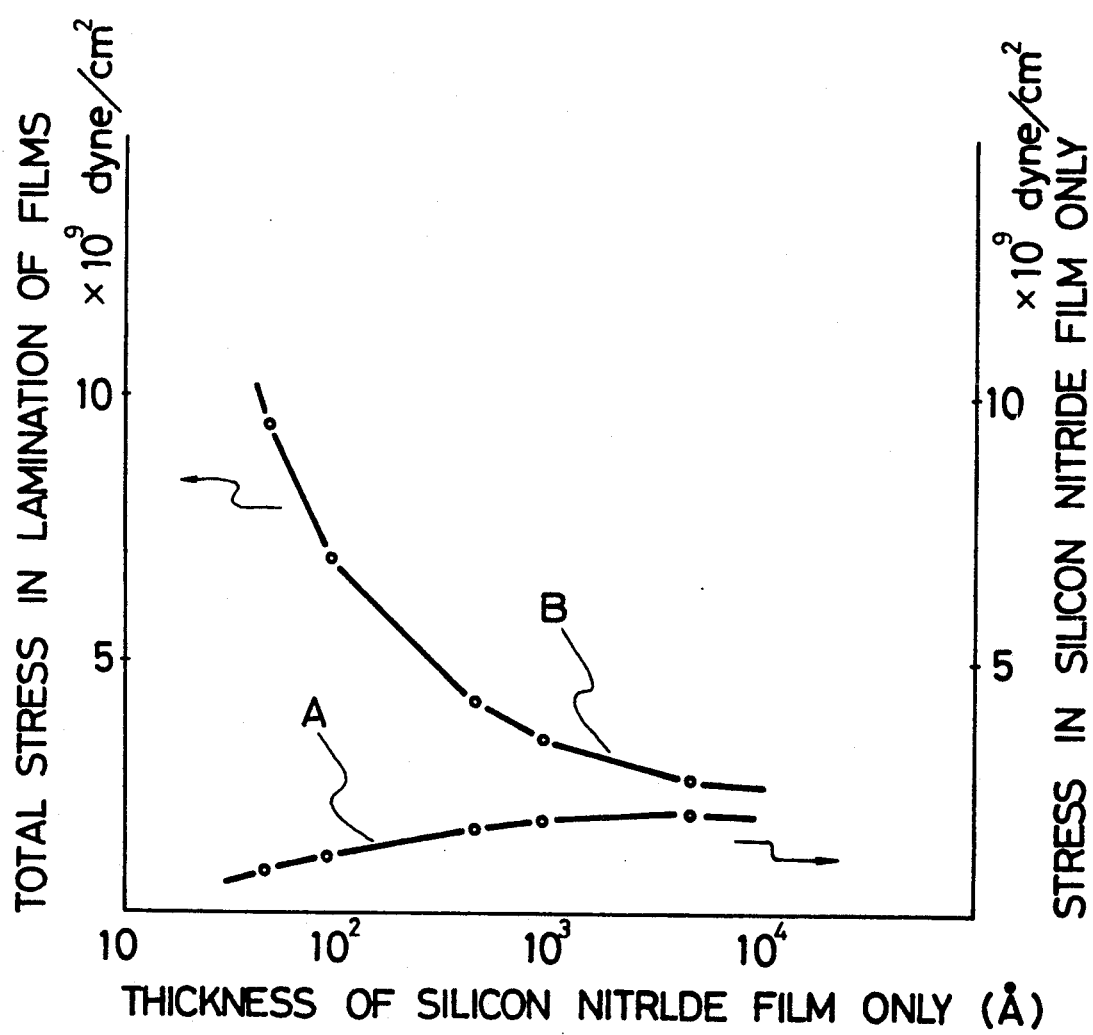
FIG. 3 and FIG. 4 are graphs showing the relationship between film thickness and film stress.

FIG. 3 is a graph showing the relation between the stress and the changes in thickness of a silicon nitride film layer directly formed on a silicon substrate in the present invention. This graph also shows the total stress in the lamination of films where the carbon-type film having a thickness to 5000 angstrom is directly formed on the silicon nitride film.

As shown by curve A, where the silicon nitride only is formed, with changes from 50 angstrom to 5000 angstrom in the thickness of silicon nitride, the compressive stress is kept in the range of from $1 \times 10^9$ dyne/cm$^2$ to $2.7 \times 10^9$ dyne/cm$^2$, and did not change much depending on the film thickness.

However, as shown by curve B, where a carbon-type film with a 5000 angstrom thickness is formed on the silicon nitride, film thickness dependency is produced. In a region where the silicon nitride film is thin, the total stress in the lamination of films is high and a reduction effect in the total stress is not demonstrated, but in a region where the silicon nitride film is thick, specifically in a thickness of about several thousand angstrom units, a tendency toward the reduction in the total stress in the lamination of films is demonstrated, which should be compared with curve A where the compressive stress of the silicon nitride film only is almost uniform generally over the thickness range. This is because the stress strain is reduced by the improvement in lattice nonalignment from the presence of silicon nitride and by improvement in thermal stress from the presence.

Figure 4:
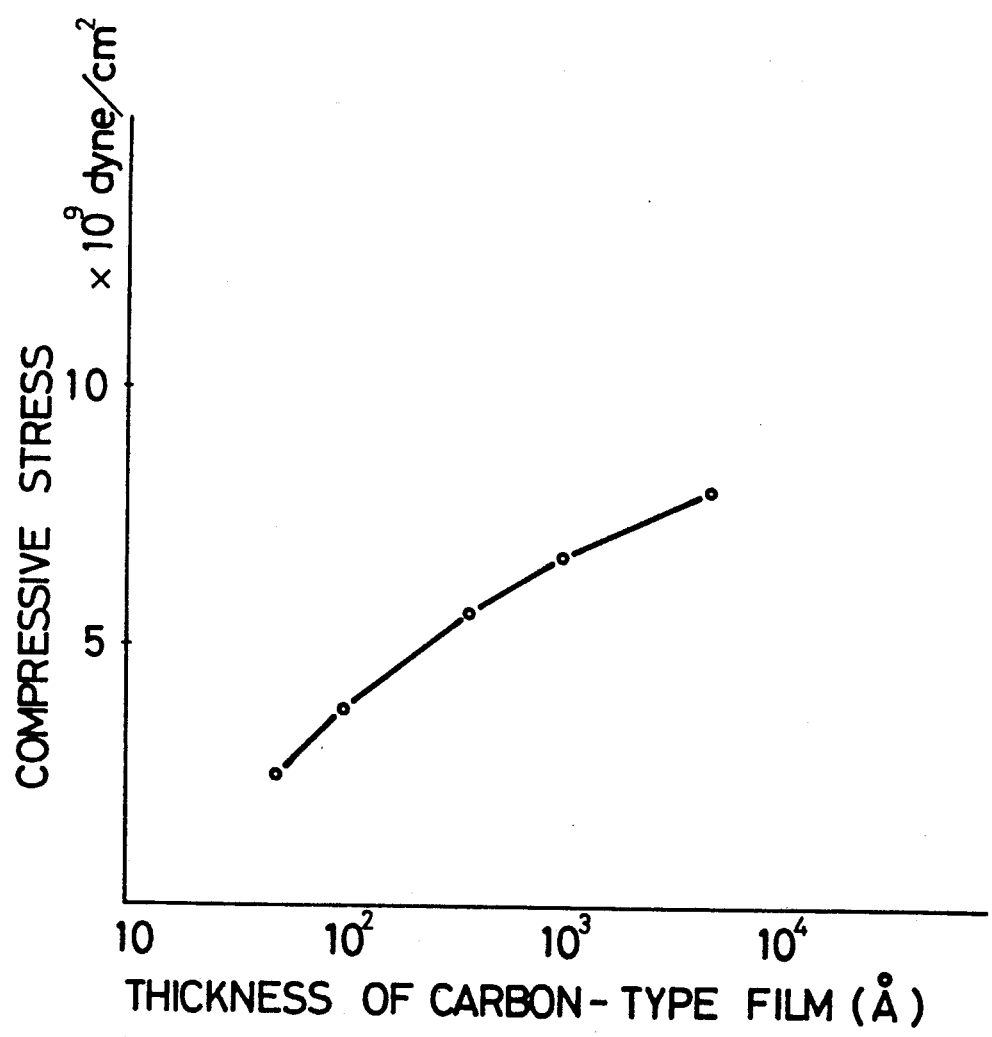

FIG. 4 is a graph showing the relation between the stress and changes in thickness of a carbon-type film formed on a silicon nitride film in some laminations of films in the present invention. A silicon substrate is used in this embodiment and a silicon nitride film which is 5000 angstrom thick is provided directly on the substrate. As shown in FIG. 4, there is a great tendency that the total stress, specifically the stress integrated in the direction of the film thickness, increases with increasing thickness of the carbon-type film. It can therefore be understood that some means is necessary to get the maximum advantages of the lamination of films in the present invention.

Figure 5:
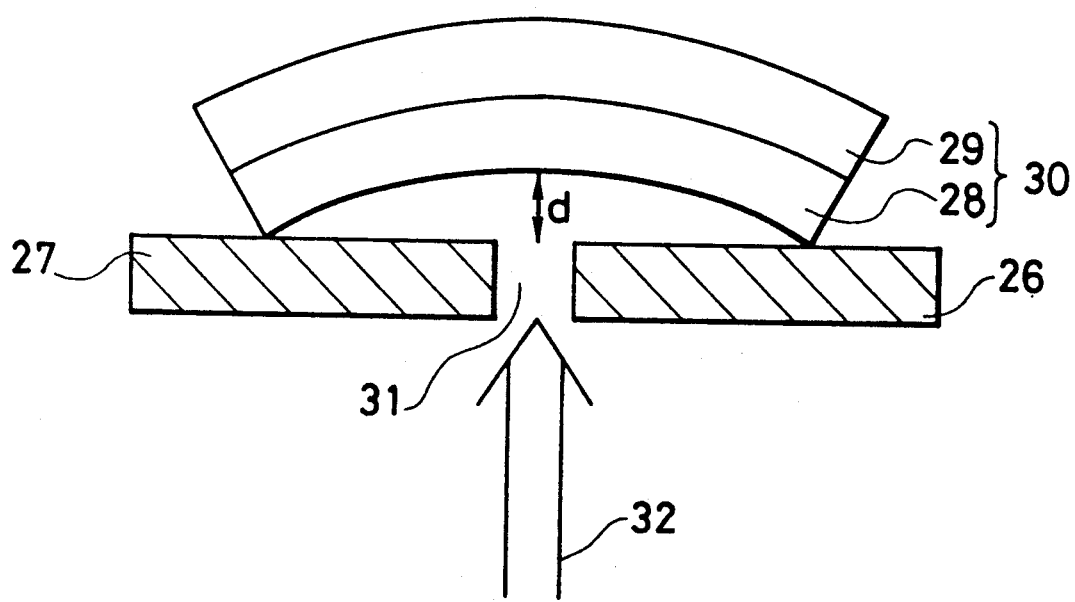
FIG. 5 is a diagram outlining a method of measuring a warp.

The values of stress in FIG. 3 and FIG. 4 were obtained by the warp measurement method illustrated in FIG. 5. In FIG. 5, a pair of support blocks 26, 27 are provided with flat surfaces. A test sample 30 comprising a substrate 28 and a lamination of films 29 on the substrate 28 is supported on the support blocks 26, 27. An optical system beam 32 is shone through an open section 31, and the measurement d in FIG. 5 is obtained. The stress in the test sample 30 is obtained from the measurement d. The above explanation was given for a lamination of films 29, but the stress is obtained in exactly the same way when the lamination of films 29 is replaced by a silicon nitride film only.

In accordance with another embodiment, the silicon nitride layer is formed by a plasma CVD process utilizing SiH$_4$ and N$_2$ gases on a magnetic disc which is coated with a magnetic iron oxide in the following deposition condition:

| substrate temperature: | 150-300° C. |
|---|---|
| SiH$_4$/N$_2$ (volume ratio): | 1/100-25/100 |
| reaction pressure: | 1 Pa-100 Pa |

By the above deposition condition, a silicon nitride layer is formed having a thickness 30-3000 Å, preferably 100-1000 Å. The hydrogen concentration of thus formed silicon nitride layer is measured as 15-20 atomic %.

For comparison, a silicon nitride layer is deposited by a plasma CVD from SiH$_4$ and NH$_3$ with other conditions same as those of the present embodiment. The concentration of the hydrogen in the film was 23-28 atomic %.

In place of the SiH$_4$ gas, it is also possible to utilize SiH$_2$Cl$_2$ gas.

On the silicon nitride layer formed in accordance with the present invention, a carbon layer is deposited by a plasma CVD. Thus, the laminate member of the present invention can be formed.

In the present invention, the oxide material used as the substrate may be magnetic materials such as y-FeO$_3$, ceramic materials such as an alumina or oxide superconducting materials, or glass. Also, the carbon layer in accordance with the present invention is amorphous carbon or preferably diamond-like carbon or crystalline carbon. The diamond-like carbon is a mixture of an amorphous carbon and a carbon having SP$^3$ bonds. The present invention is especially effective when the carbon layer is a diamond-like carbon or crystalline carbon which has a high hardness, e.g., 2000 kg/mm$^2$ or more (Vickers hardness). This is because such a layer having a high hardness has a larger internal stress, and it is necessary to reduce the influence of the stress.

Since other modifications and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A method for forming a carbon film on a substrate made of an oxide material comprising the steps of:
    forming a silicon nitride layer containing hydrogen at 2-28 atomic % on a surface of said substrate; and
    forming a carbon layer on said silicon nitride layer.
2. The method of claim 1 wherein said silicon nitride is formed by vapor phase deposition method utilizing SiH$_4$ and N$_2$ gases.
3. The method of claim 2 wherein the volume ratio of said SiH$_4$ and N$_2$ gases (SiH$_4$/N$_2$) is 1/100 to 25/100.
4. The method of claim 1 wherein said silicon nitride is formed by vapor phase deposition method utilizing SiH$_4$ and NH$_3$ gases.
5. The method of claim 1 wherein said silicon nitride layer is formed by vapor phase deposition utilizing SiH$_2$Cl$_2$ and either NH$_3$ or N$_2$ gases.
6. The method of claim 1 wherein said oxide material is selected from the group consisting of a magnetic material, a ceramic material and glass.
7. The method of claim 6 wherein the substrate made of said magnetic material is a magnetic disc or optical magnetic disc.
8. The method of claim 1 wherein the thickness of said silicon nitride layer is 15-25% of the thickness of said carbon layer.
9. The method of claim 1 wherein the thickness of said silicon nitride layer is 30-3000 angstroms.
10. The method of claim 1 wherein said carbon layer comprises a diamond-like carbon or crystalline carbon.

* * * * *